United States Patent
Suzuki et al.

(10) Patent No.: US 6,201,260 B1
(45) Date of Patent: Mar. 13, 2001

(54) THIN FILM TRANSISTOR AND METHOD OF MANUFACTURING THE SAME

(75) Inventors: Mitsuaki Suzuki; Shinichi Kamagami, both of Fukaya; Takuji Nakazono, Kumagaya, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/152,253

(22) Filed: Sep. 14, 1998

(30) Foreign Application Priority Data

Sep. 25, 1997 (JP) .................................................. 9-259892

(51) Int. Cl.⁷ .................................................. H01L 29/76
(52) U.S. Cl. ............................................ 257/66; 257/655
(58) Field of Search ............................ 257/66, 402, 655, 257/657

(56) References Cited

FOREIGN PATENT DOCUMENTS 4-315441    11/1992    (JP).

*Primary Examiner*—Mark V. Prenty
(74) *Attorney, Agent, or Firm*—Pillsbury Winthrop LLP

(57) ABSTRACT

A thin film transistor of this invention has a structure obtained by sequentially stacking, on an insulating substrate, a silicon nitride film, a silicon oxide film, a polysilicon thin film with a channel region and source and drain regions facing each other via the channel region, an insulating film, and a gate electrode. The boron concentration decreases from the channel region toward the silicon nitride film in the silicon oxide film region between the channel region and the silicon nitride film. The silicon oxide film region between the channel region and the silicon nitride film is made up of a first region which is in contact with the channel region and has a boron concentration of $1 \times 10^{16}$ atoms/cm$^3$ or more, and a second region between the first region and the silicon nitride film, which has a boron concentration of less than $1 \times 10^{16}$ atoms/cm$^3$. The first region has a thickness of 200 Å or less.

3 Claims, 4 Drawing Sheets

THIN FILM TRANSISTOR AND METHOD OF MANUFACTURING THE SAME

BACKGROUND OF THE INVENTION

The present invention relates to a thin film transistor and a method of manufacturing the same and, more particularly, to a polysilicon thin film transistor formed on an insulating substrate such as a glass substrate, and a method of manufacturing the same.

In a thin film transistor having a polysilicon channel region, the field-effect mobilities of electrons and holes are larger than in a thin film transistor having an amorphous silicon channel region. The polysilicon thin film transistor therefore has a high current drive capability and is being used in liquid crystal display apparatuses and the like.

Regardless of its excellent characteristics, however, the polysilicon thin film transistor suffers the following problem.

More specifically, in the polysilicon thin film transistor, its characteristics and particularly its threshold voltage are greatly influenced by defects, impurities, and the like in the channel region. As a result, the threshold voltage may greatly shift from a value necessary for the operation of the transistor circuit. For example, in an n-channel transistor, the threshold voltage shifting to the negative side with respect to 0V makes the transistor have normally ON characteristics, failing normal switching.

To solve this problem, the threshold voltage is controlled by implanting, e.g., boron ions in the channel region using an ion implanter or an ion doping apparatus. According to this method, however, ion implantation or ion doping must be performed in addition to formation of the channel region. Accordingly, the number of steps of manufacturing a liquid crystal display device or the like increases, and the throughput as the productivity per unit time decreases. In addition, this method requires another apparatus, and thus the manufacturing cost increases.

The amount of boron ions implanted in the channel region to control the threshold voltage is very small. However, when an ion implanter or ion doping apparatus is used, the boron dose cannot be accurately controlled, and the thin film transistor cannot be manufactured with high reproducibility and high stability.

For example, boron ions are implanted in the channel region using an ion implanter or an ion doping apparatus in manufacturing a thin film transistor having a structure in which a silicon nitride film, a silicon oxide film, and a polysilicon thin film forming the channel region are sequentially stacked on a glass substrate. In this case, the boron concentration distribution shown in FIG. 1 is generally obtained.

FIG. 1 is a graph showing the boron concentration distribution obtained when a thin film transistor is formed by a conventional method. In FIG. 1, the abscissa represents the boron dose, and the ordinate represents the distance from the glass substrate.

As is often the case with the conventional method, the boron concentration in the silicon oxide film gradually decreases from the polysilicon thin film toward the silicon nitride film as shown in FIG. 1. It is noted that a high boron concentration is obtained in not only the polysilicon thin film but also the interface region between the silicon oxide film and the silicon nitride film. This is because the surface of the silicon nitride thin film is contaminated before forming the silicon oxide film.

The threshold voltage does not greatly vary between thin film transistors as far as the amount of boron ions implanted in the silicon oxide thin film and the silicon nitride thin film is very small or constant.

However, when an ion implanter or ion doping apparatus is used, it is difficult to prevent a non-negligible amount of boron ions from being implanted in the silicon oxide thin film and the silicon nitride thin film. The amount of boron ions implanted in the silicon oxide film and the silicon nitride film greatly depends on implantation conditions such as the boron ion acceleration voltage, and these implantation conditions cannot be kept unchanged. For this reason, in the conventional method, the threshold voltage greatly varies between thin film transistors.

BRIEF SUMMARY OF THE INVENTION

The present invention has been made to solve the above problems, and has as its object to provide a thin film transistor which can be manufactured without increasing the number of manufacturing steps and varying the threshold voltage, and a method of manufacturing the same.

To achieve the above object, according to the present invention, there is provided a thin film transistor comprising an insulating substrate, a silicon nitride film formed on the insulating substrate, a silicon oxide film formed on the silicon nitride film, a polysilicon thin film formed on the silicon oxide film, the polysilicon thin film having a channel region containing boron as an impurity at a concentration of $5 \times 10^{16}$ to $1.5 \times 10^{18}$ atoms/cm$^3$, and source and drain regions facing each other via the channel region, an insulating film formed on the polysilicon thin film, and a gate electrode formed on the insulating film, wherein the boron concentration decreases from the channel region toward the silicon nitride film in a region of the silicon oxide film between the channel region and the silicon nitride film, and the region of the silicon oxide film between the channel region and the silicon nitride film is made up of a first region in contact with the channel region, which has a boron concentration of not less than $1 \times 10^{16}$ atoms/cm$^3$, and a second region between the first region and the silicon nitride film, which has a boron concentration of less than $1 \times 10^{16}$ atoms/cm$^3$, the first region having a thickness of not more than 200 Å.

According to the present invention, there is provided a method of manufacturing a thin film transistor, comprising the steps of sequentially stacking a silicon nitride film and a silicon oxide film on an insulating substrate, stacking a non-singlecrystal silicon thin film on the silicon oxide film, depositing boron on an upper surface of at least one of the silicon oxide film and the non-singlecrystal silicon thin film, and irradiating light onto the non-singlecrystal silicon thin film to fuse and crystallize the non-singlecrystal silicon thin film, and to diffuse the deposited boron into the fused non-singlecrystal silicon thin film, thereby forming a boron-doped polysilicon thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail below with reference to the several views of the accompanying drawing.

FIGS. 2A to 2F are sectional views, respectively, schematically showing the steps in manufacturing a thin film transistor according to an embodiment of the present invention. A thin film transistor 1 shown in FIG. 2F can be manufactured by, e.g., the following method.

Figure 2A:
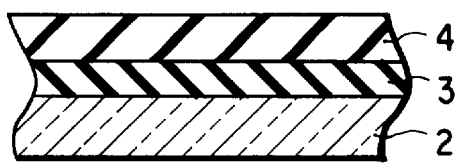
FIGS. 2A to 2F are sectional views, respectively, schematically showing the steps in manufacturing a thin film transistor according to an embodiment of the present invention.

As shown in FIG. 2A, a nitride film 3 and an oxide film 4 are sequentially stacked on a glass substrate 2 as an insulating substrate by, e.g., plasma CVD. As the insulating substrate, a transparent substrate such as the glass substrate 2, and a substrate having no optical transparency can be used. As the glass substrate 2, a low-impurity non-alkali glass substrate having a low concentration of impurities such as sodium is preferably used in order to prevent diffusion of any impurity from the glass substrate 2.

As the nitride film 3 and the oxide film 4, a silicon nitride film and a silicon dioxide film are preferably used. To prevent the mixing of any unwanted impurity, it is desirable to successively form the oxide film 4 without breaking vacuum after formation of the nitride film 3. The nitride film 3 and the oxide film 4 formed in this manner can prevent the mixing of any impurity into the channel region from the substrate 2.

Figure 2D:
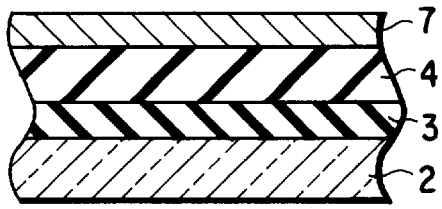
Figure 2B:
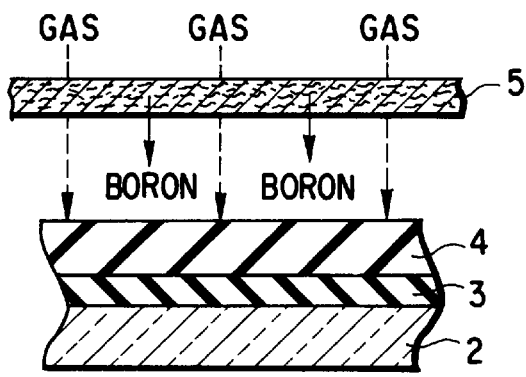

As shown in FIG. 2B, the substrate 2 having the nitride film 3 and the oxide film 4 is exposed to a boron-containing atmosphere to allow the surface of the oxide film 4 to adsorb boron.

The boron-containing atmosphere can be prepared using an air filter 5 called a HEPA filter used in a clean room or the like. This HEPA filter is made of a glass fiber containing boron as a main component. The boron-containing atmosphere can therefore be obtained by passing air or an inert gas such as nitrogen gas, argon gas, or neon gas through the HEPA filter. By placing the substrate 2 on the downstream side of the HEPA filter, boron or a boron compound can be adsorbed on the surface of the oxide film 4.

The boron adsorption amount in the oxide film 4 is preferably $4 \times 10^{10}$ atoms/cm$^2$ or more. In this case, the threshold voltage of a thin film transistor 1 manufactured can be satisfactorily controlled. The boron adsorption amount in the oxide film 4 is preferably $5 \times 10^{12}$ atoms/cm$^2$ or less. In this case, the threshold voltage can be suppressed low.

The boron adsorption amount in the oxide film 4 can be controlled by adjusting the exposure time of the substrate 2 to the boron atmosphere or the boron concentration in the atmosphere. In general, when such a filter is used, the boron concentration in the atmosphere hardly changes over time. The adsorption amount in the oxide film 4 can therefore be controlled to a desired value by periodically measuring the boron concentration in the atmosphere and adjusting the exposure time of the substrate 2 to the boron atmosphere. In other words, the amount of boron contained in a channel region 8 can be controlled to a desired value.

The boron concentration in the atmosphere is preferably $5 \times 10^{12}$ atoms/L or more. In this case, a satisfactory amount of boron can be adsorbed in the oxide film 4 within a relatively short time. The boron concentration in the atmosphere is preferably $5 \times 10^{15}$ atoms/L or less. In this case, the boron adsorption amount can be easily controlled.

Figure 2E:
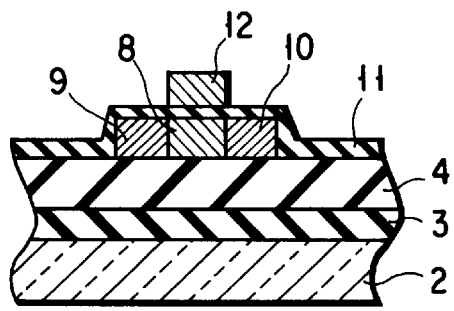
Figure 2C:
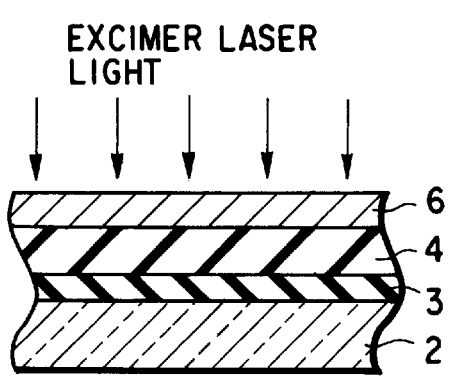

As shown in FIG. 2C, a non-singlecrystal silicon film 6 is formed on the oxide film 4 that has adsorbed boron on its surface, and is thermally annealed. As the non-singlecrystal silicon film 6, an amorphous silicon film, a microcrystal silicon film, and a polycrystal silicon (polysilicon) film are available.

As shown in FIG. 2D, light is irradiated on the non-singlecrystal silicon film 6 to instantaneously fuse only the non-singlecrystal silicon film 6. This light irradiation is performed by emitting visible light, ultraviolet light, or infrared light by a laser, such as an excimer laser, or a lamp.

This light irradiation diffuses most of the boron adsorbed in the surface of the oxide film 4 into the fused non-singlecrystal silicon film and also electrically activates boron. The fused, boron-diffused non-singlecrystal silicon film 6 crystallizes to form a polysilicon film 7 containing boron at a concentration of, e.g., $5 \times 10^{16}$ to $1.5 \times 10^{18}$ atoms/cm$^3$.

The remaining boron adsorbed in the surface of the oxide film 4 diffuses into the oxide film 4. When the non-singlecrystal silicon film 6 fuses, the oxide film 4 does not fuse. For this reason, boron does not uniformly diffuse into the oxide film 4 but diffuses into that region of the oxide film 4, which is in contact with the non-singlecrystal silicon film 6. That is, boron is contained in the oxide film 4 at a higher concentration on the polysilicon film 7 side but is substantially not contained on the nitride film 3 side. The boron concentration in the oxide film 4 will be explained in more detail with reference to FIG. 3.

Figure 1:
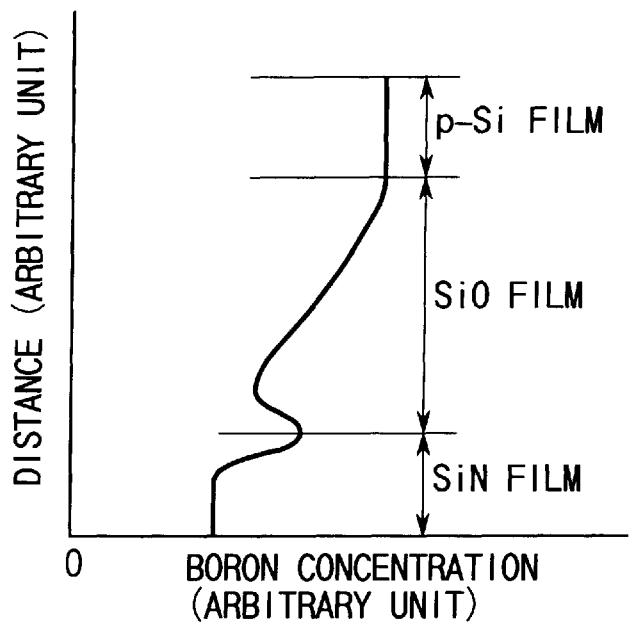
FIG. 1 is a graph showing the boron concentration distribution obtained when a thin film transistor is formed by a conventional method.
Figure 3:
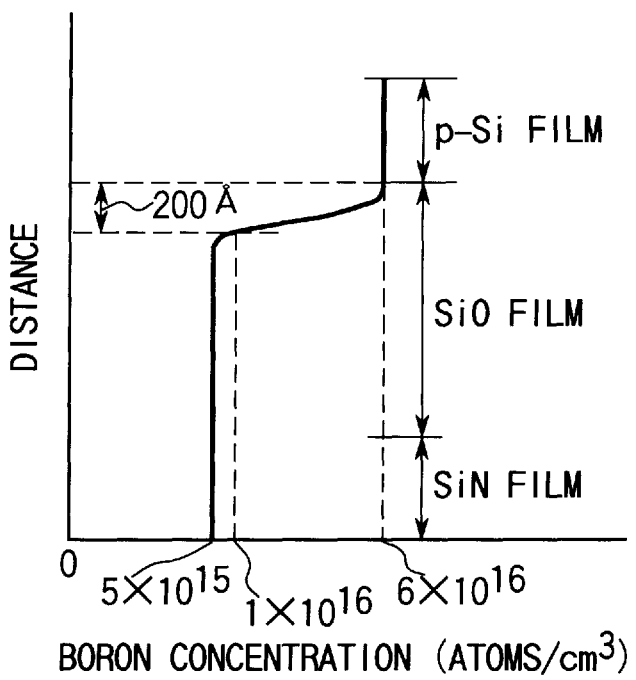
FIG. 3 is a graph showing the boron concentration distribution obtained when the thin film transistor according to the embodiment of the present invention is formed.

FIG. 3 is a graph showing an example of the boron concentration distribution obtained when the thin film transistor 1 is formed by the method according to this embodiment of the present invention. In FIG. 3, the abscissa represents the boron concentration, and the ordinate represents the distance from the glass substrate 2.

As shown in FIG. 3, the boron concentration is constant in the polysilicon film 7. A boron concentration gradient appears in that region of the silicon oxide film 4, which is in contact with the polysilicon film 7. The boron concentration decreases from the polysilicon film 7 toward the silicon nitride film 3. The boron concentration is constant in that region of the silicon oxide film 4, which is in contact with the silicon nitride film 3 and in the silicon nitride film 3.

Using the position where the boron concentration is $1\times10^{16}$ atoms/cm$^3$ as a boundary, that region of the silicon oxide film 4, which is in contact with the polysilicon film 7 is defined as the first region, and that region which is in contact with the silicon nitride film 3 is defined as the second region. By the above method, the first region corresponds to that region of the silicon oxide film 4, which is in contact with the silicon nitride film 3 where a boron concentration gradient appears, and generally has a thickness of 200 Å or less. In the second region, the boron concentration is substantially constant. The boron concentration in the second region and the silicon nitride film 3 is lower than $1\times10^{16}$ atoms/cm$^3$.

According to this embodiment, the first region can be controlled to be very thin without diffusing boron into the second region and the silicon nitride film 3. This control can be done due to the following reason. That is, according to the above method, boron does not diffuse into a deep portion of the oxide film 4 in boron adsorption. The adsorbed boron diffuses into the fused non-singlecrystal silicon film 6 more easily than into the unfused oxide film 4.

Unlike the case using an ion implanter or an ion doping apparatus, boron can be contained in substantially only the polysilicon film 7 and the first region, and the first region can be controlled to be thin. According to the method of this embodiment, the boron amount contained in the films except for the polysilicon film 7 can be reduced to a negligible degree, compared to the boron amount contained in the polysilicon film 7.

As described above, the boron adsorption amount in the oxide film 4 can be controlled by adjusting the exposure time of the substrate 2 to the boron atmosphere or the boron concentration in the atmosphere. By the above method, the boron concentration in the atmosphere hardly changes over time. Therefore, the adsorption amount in the oxide film 4 can be controlled to a desired value.

More specifically, according to the method of this embodiment, the boron adsorption amount in the oxide film 4 can be controlled with high precision, and the adsorbed boron can be diffused into substantially only the polysilicon film 7 and the first region. According to the method of this embodiment, the boron concentration in the polysilicon film 7 is the same between thin film transistors, and thus variations in threshold voltage can be reduced.

As shown in FIG. 2E, the polysilicon film 7 is patterned into a desired shape, a gate insulating film 11 is formed on the patterned polysilicon film 7, and a gate electrode 12 having a predetermined shape is formed on the gate insulating film 11. Phosphorus or boron is doped in the polysilicon film 7 by ion doping using the gate electrode 12 as a mask to form phosphorus- or boron-doped source and drain regions 9 and 10 and a channel region 8 between them.

Figure 2F:
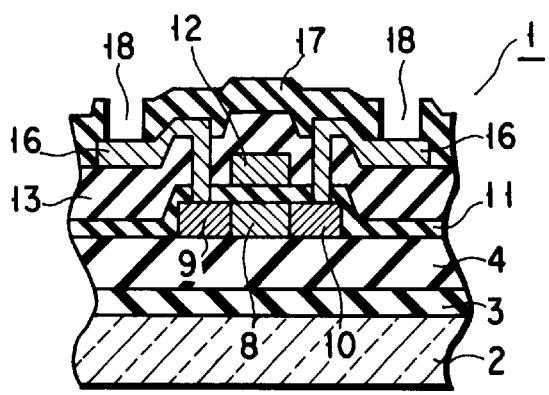

As shown in FIG. 2F, an interlayer insulating film 13 is formed on the gate insulating film 11 and the gate electrode 12. Contact holes 14 and 15 are formed in the interlayer insulating film 13 to reach the source and drain regions 9 and 10. A conductive thin film such as a metal thin film is formed by sputtering or the like to fill the contact holes 14 and 15 and patterned so as to form signal electrode lines 16.

An insulating film 17 is formed on the interlayer insulating film 13 having the signal electrode lines 16, and through holes 18 are formed to the end portions of the signal electrode lines 16, thereby obtaining a thin film transistor 1.

The case wherein the non-singlecrystal silicon film 6 is formed after boron is adsorbed in the oxide film 4 has been described. Instead, boron may be adsorbed in the non-singlecrystal silicon film 6 after the non-singlecrystal silicon film 6 is formed on the oxide film 4. In this case, since the nitride film 3, the oxide film 4, and the non-singlecrystal silicon film 6 can be successively formed without breaking vacuum, the mixing of any impurity can be further reduced.

Boron may be deposited on the oxide film 4 or the non-singlecrystal silicon film 6 using a boron-containing solution. For example, the substrate 2 having the oxide film 4 or the non-singlecrystal silicon film 6 is dipped in an aqueous compound solution containing boron such as boric acid, and spin-dried. As a result, a boron-containing compound is deposited on the surface of the oxide film 4 or the non-singlecrystal silicon film 6.

When light is irradiated on the substrate 2 with the boron-containing compound deposited thereon to fuse the non-singlecrystal silicon film 6 in the above manner, the boron compound decomposes and diffuses into the non-singlecrystal silicon film 6 to form a boron-doped polysilicon film 7. At this time, if boric acid or the like is used as a boron compound, the polysilicon film 7 is not contaminated by a metal because the byproduct produced upon decomposition does not contain any metal.

When such a boron-containing solution is used, the substrate 2 is desirably rinsed with pure water or the like after the boron compound is deposited on the substrate 2 in order to remove any impurity contained in the solution. In this case, the solution is preferably adjusted to a higher concentration because the boron compound deposited on the surface of the oxide film 4 or the non-singlecrystal silicon film 6 is also partially removed.

Although the boron-containing solution can be used in the above way, the boron atmosphere is more preferably used. In the case using the boron atmosphere, the boron concentration in the polysilicon film 7 can be controlled with higher precision than in the case using the boron-containing solution.

Examples of the present invention will be described.

Example 1

The thin film transistor shown in FIG. 2F was manufactured as follows.

As shown in FIG. 2A, a 50-nm thick silicon nitride film 3 and a 100-nm thick silicon dioxide film 4 were sequentially stacked on a non-alkali glass substrate 2 using a plasma CVD apparatus. The silicon nitride film 3 and the silicon dioxide film 4 were successively formed without breaking vacuum.

An atmosphere containing boron and a boron compound was formed in a predetermined vessel by introducing an inert gas through a HEPA filter 5. The interior of the vessel was a so-called class 10 clean zone having 10 dustparticles/m$^3$ or less.

Figure 4:
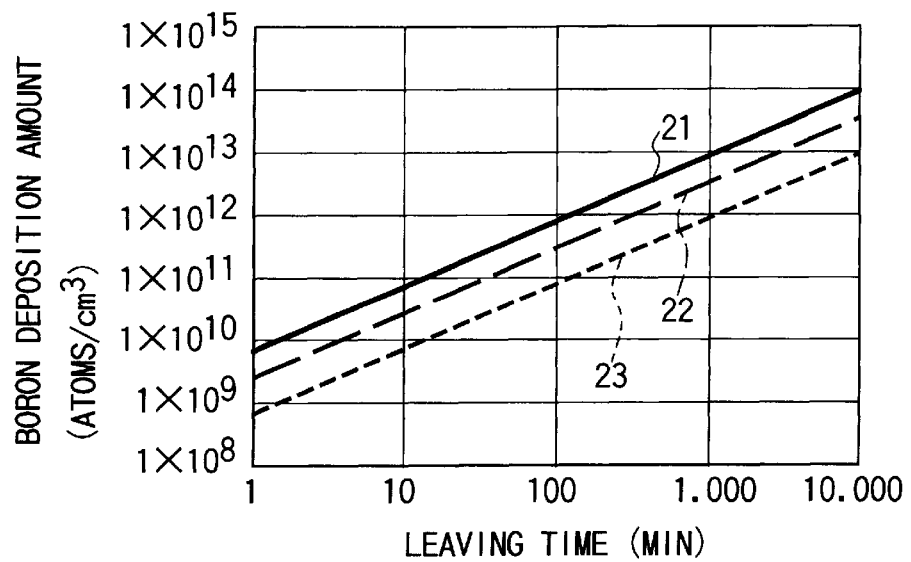
FIG. 4 is a graph showing the relationship between the leaving time and the boron adsorption amount in the process of manufacturing the thin film transistor according to the embodiment of the present invention.

FIG. 4 is a graph showing the relationship between the leaving time and the boron adsorption amount obtained when the substrate 2 having the silicon dioxide film 4 was set in the atmosphere. In FIG. 4, the abscissa represents the setting time, i.e., the leaving time (min) the substrate 2 was left to stand in the vessel, and the ordinate represents the number of atoms per unit area as the boron deposition amount on the surface of the silicon dioxide film 4. A solid line 21, a broken line 22, and a dotted line 23 respectively indicate data for boron concentrations of $5\times10^{13}$ atoms/L, $2\times10^{13}$ atoms/L, and $5\times10^{12}$ atoms/L.

As is apparent from FIG. 4, the amount of boron deposited on the silicon dioxide film 4 can be increased by increasing the boron concentration in the atmosphere and prolonging the leaving time.

Based on these data, as shown in FIG. 2B, the substrate 2 having the silicon dioxide film 4 was left to stand in a boron-containing atmosphere at a concentration of $2 \times 10^{13}$ atoms/L for 90 min to allow the surface of the silicon dioxide film 4 to adsorb boron and a boron compound at a concentration of $2.5 \times 10^{11}$ atoms/cm$^2$.

As shown in FIG. 2C, a 60-nm thick amorphous silicon film 6 was formed on the silicon dioxide film 4 and thermally annealed in a nitrogen atmosphere at a temperature of 450° C. for 1 hour.

As shown in FIG. 2D, excimer laser light was irradiated on the amorphous silicon film 6 to fuse the film 6. At this time, boron deposited on the surface of the silicon dioxide film 4 diffused into the fused amorphous silicon film 6. As a result, a boron-doped polysilicon film 7 was obtained.

Figure 5A:
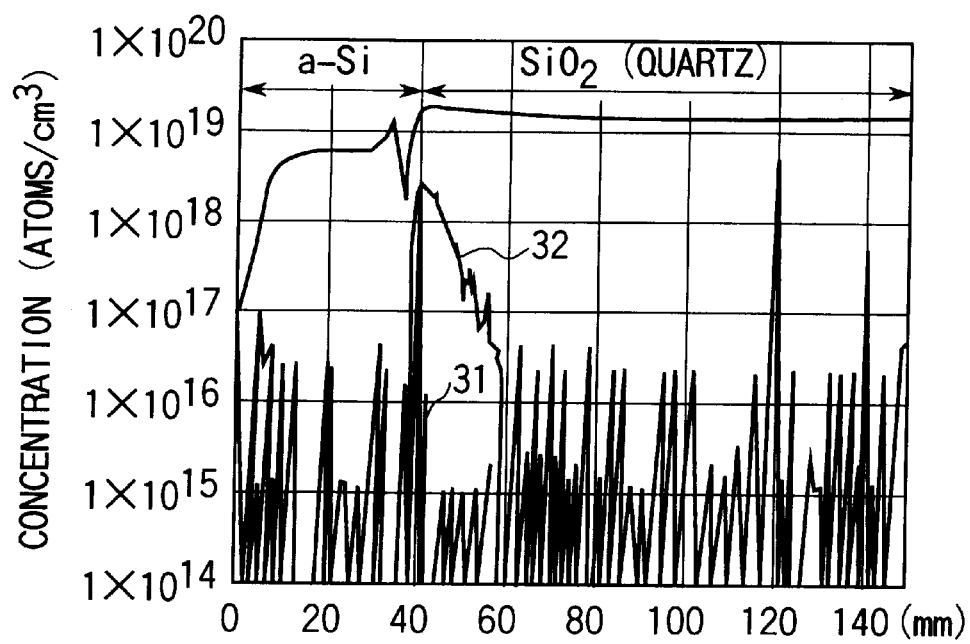
FIGS. 5A and 5B are graphs, respectively, showing the boron diffusion state before and after excimer laser irradiation in the process of manufacturing the thin film transistor according to the embodiment of the present invention.
Figure 5B:
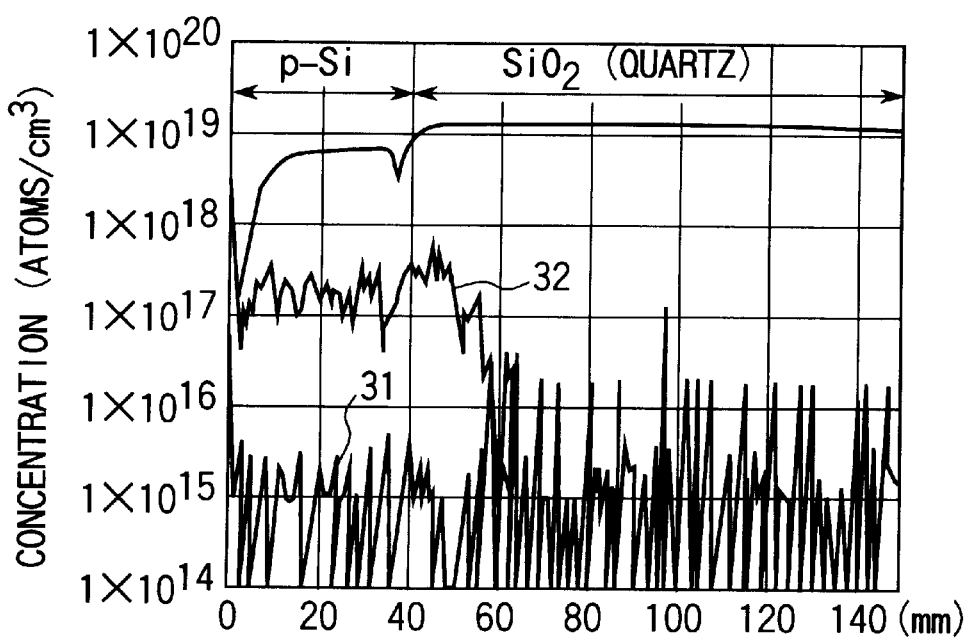

FIGS. 5A and 5B are graphs, respectively, showing the boron diffusion state before and after excimer laser irradiation. FIGS. 5A and 5B respectively show the sodium and boron concentrations in the amorphous silicon film 6 and the silicon dioxide film 4, and in the polysilicon film 7 and the silicon dioxide film 4, which were obtained by SIMS analysis. In FIGS. 5A and 5B, the abscissa represents the position from the surface of the amorphous silicon film 6 or the polysilicon film 7, and the ordinate represents the sodium or boron concentration at a corresponding position.

In FIGS. 5A and 5B, curves 31 and 32 respectively indicate data for sodium and boron. These data were obtained by SIMS analysis, before and after excimer laser irradiation, of the structure in which a 40-nm thick amorphous silicon film 6 was formed on a quartz substrate used in place of the silicon dioxide film 4.

As shown in FIG. 5A, before excimer laser irradiation, boron was distributed on the surface of the silicon dioxide film 4 (quartz substrate), and had not diffused into the amorphous silicon film 6. To the contrary, as shown in FIG. 5B, after excimer laser irradiation, boron had uniformly diffused into the polysilicon film 7. In the silicon dioxide film 4 (quartz substrate), a boron concentration gradient was formed in the region 20 nm from the interface with the polysilicon film 7, i.e., in the 200-Å region, and no boron was detected in any deeper region.

As shown in FIG. 2E, the polysilicon film 7 was patterned, a gate insulating film 11 was formed on the patterned polysilicon film 7 using silicon dioxide, and a gate electrode 12 having a predetermined shape was formed on the gate insulating film 11. Phosphorus was doped in the polysilicon film 7 by ion doping using the gate electrode 12 as a mask to form phosphorus-doped source and drain regions 9 and 10 and a channel region 8 between them.

As shown in FIG. 2F, the resultant structure was heated in a nitrogen atmosphere at a temperature of 500° C. to form an interlayer insulating film 13 made of silicon dioxide on the gate insulating film 11 having the gate electrode 12. Contact holes 14 and 15 were formed in the interlayer insulating film 13, and then Mo, Al, and Mo films were sequentially formed by sputtering to fill these contact holes 14 and 15 and patterned to form signal electrode lines 16.

A 450-nm thick silicon nitride film 17 was formed on the interlayer insulating film 13 having the signal electrode lines 16, and through holes 18 were formed to the end portions of the signal electrode lines 16, thereby obtaining an n-channel thin film transistor 1 shown in FIG. 2F.

In the n-channel thin film transistor 1, the channel region 8 contained boron at a concentration of about $5.0 \times 10^{16}$ atoms/cm$^3$. LDD regions (not shown) were formed between the source and drain regions 9 and 10 and the channel region 8. A transparent electrode, an auxiliary capacitor, and the like (none of them are shown) were formed on the substrate 2 having the thin film transistor 1.

Comparative Example 1

An n-channel thin film transistor was manufactured similarly to Example 1 except that no boron was deposited on the silicon dioxide film 4.

Figure 6:
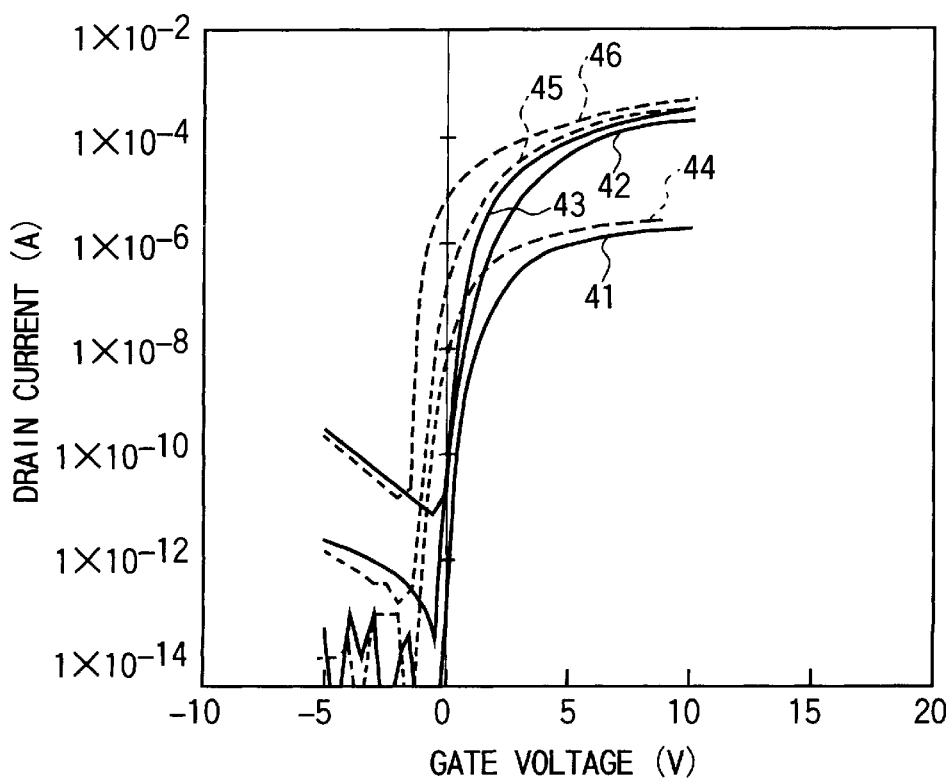
FIG. 6 is a graph showing the relationship between the gate voltage and the drain current in the thin film transistors according to an example and a comparative example of the present invention.

The relationship between the gate voltage and the drain current was checked for both the n-channel thin film transistors manufactured in Example 1 and Comparative Example 1. FIG. 6 shows the results.

FIG. 6 is a graph showing the relationship between the gate voltage and the drain current in the thin film transistors according to Example 1 and Comparative Example 1. In FIG. 6, the abscissa represents the gate voltage, and the ordinate represents the drain current.

In FIG. 6, solid curves 41, 42, and 43 respectively indicate data obtained when voltages of 0.05V, 5V, and 10V were applied to the drain region 10 of the thin film transistor 1 according to Example 1. Broken curves 44, 45, and 46 respectively indicate data obtained when voltages of 0.05V, 5V, and 10V were applied to the drain region of the thin film transistor according to Comparative Example 1.

As shown in FIG. 6, in the thin film transistor of Comparative Example 1, although the field-effect mobility was as high as 110 cm$^2$/Vs, the threshold voltage was as low as 0.7V, showing normally ON characteristics. That is, in the thin film transistor of Comparative Example 1, a large current flows through the drain region even in the OFF state, i.e., even at a gate voltage of 0V, failing normal switching.

In contrast, in the thin film transistor of Example 1, the field-effect mobility was as high as 95 cm$^2$/Vs, and the threshold voltage was 1.9V, which is much higher than the threshold voltage of the thin film transistor of Comparative Example 1. The threshold voltage hardly varied between thin film transistors. The leakage current to the drain region 10 at a gate voltage of 0V was suppressed much smaller than in the thin film transistor of Comparative Example 1.

Example 2

An n-channel thin film transistor 1 was manufactured following the same procedure as Example 1 except that the boron adsorption amount in the silicon dioxide film 4 was set at $4 \times 10^{10}$ atoms/cm$^2$.

The relationship between the gate voltage and the drain current was checked for this thin film transistor 1 to obtain a threshold voltage of 0.9V, which was 0.2V higher than the threshold voltage of the thin film transistor of Comparative Example 1.

Example 3

An n-channel thin film transistor 1 was manufactured following the same procedure as Example 1 except that boron was deposited on not the silicon dioxide film 4 but the amorphous silicon film 6.

The relationship between the gate voltage and the drain current was checked for this thin film transistor 1 to obtain almost the same characteristics as those in Example 1.

Example 4

An n-channel thin film transistor 1 was manufactured following the same procedure as Example 1 except that boron was deposited on the silicon dioxide film 4 using an aqueous boron compound solution instead of the boron atmosphere.

More specifically, a substrate 2 having a silicon dioxide film 4 was dipped in a 0.1-wt % aqueous boric acid solution, rinsed twice with pure water, and then spin-dried. Accordingly, boric acid was deposited on the surface of the silicon dioxide film 4 to manufacture a thin film transistor 1.

The relationship between the gate voltage and the drain current was checked for this thin film transistor 1 to obtain almost the same characteristics as those in Example 1.

Example 5

An n-channel thin film transistor 1 was manufactured following the same procedure as Example 4 except that boric acid was deposited on not the silicon dioxide film 4 but the amorphous silicon film 6.

The relationship between the gate voltage and the drain current was checked for this thin film transistor 1 to obtain almost the same characteristics as those in Example 4.

Comparative Example 2

An n-channel thin film transistor was manufactured following the same procedure as Example 1 except that no boron was adsorbed in the silicon dioxide film 4 but boron was implanted in the channel region 8 at a concentration of about $5.0 \times 10^{16}$ atoms/cm$^3$ using an ion implanter.

The relationship between the gate voltage and the drain current was checked for this thin film transistor to find variations in threshold voltage between thin film transistors.

As for the thin film transistors of Examples 1 to 5 and Comparative Example 2, SIMS analysis was done for the silicon dioxide film 4 and the silicon nitride film 3 below the channel region 8. As a result, in the thin film transistors 1 of Examples 1 to 5, no boron was detected in the silicon nitride film 3 and in the region of the silicon dioxide film 4 that were 200 Å from the interface with the channel region 8. To the contrary, in the thin film transistor of Comparative Example 2, boron was detected at a concentration higher than $1 \times 10^{16}$ atoms/cm$^3$ even in the region of the silicon dioxide film more than 200 Å from the interface with the channel region. Further, boron was also detected in the silicon nitride film.

As has been described above, according to the present invention, boron is deposited using a boron atmosphere or a boron compound solution so as to contact the non-singlecrystal amorphous silicon film. In forming a polysilicon film from the non-singlecrystal silicon film, boron is diffused into the polysilicon film. For this reason, no ion implanter or ion doping apparatus is used to dope boron into the polysilicon film forming the channel region. Therefore, boron can be contained in the channel region without increasing the number of manufacturing steps.

Using a boron atmosphere or boron compound solution facilitates control of the boron deposition amount. Accordingly, the boron concentration in the channel region can be easily controlled, and a thin film transistor having a desired threshold voltage can be manufactured with high stability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thin film transistor comprising:

an insulating substrate;

a silicon nitride film formed on said insulating substrate;

a silicon oxide film formed on said silicon nitride film;

a polysilicon thin film formed on said silicon oxide film, said polysilicon thin film having a channel region containing boron as an impurity at a concentration of $5 \times 10^{16}$ to $1.5 \times 10^{18}$ atoms/cm$^3$, and source and drain regions facing each other via the channel region;

an insulating film formed on said polysilicon thin film; and a gate electrode formed on said insulating film, wherein the boron concentration decreases from the channel region toward said silicon nitride film in a region of said silicon oxide film between the channel region and said silicon nitride film, and the region of said silicon oxide film between the channel region and said silicon nitride film is made up of a first region in contact with the channel region, which has a boron concentration of not less than $1 \times 10^{16}$ atoms/cm$^3$, and a second region between the first region and said silicon nitride film, which has a boron concentration of less than $1 \times 10^{16}$ atoms/cm$^3$, the first region having a thickness of not more than 200 Å.

2. A transistor according to claim 1, wherein an interface region between said silicon nitride film and said silicon oxide film that is positioned between the channel region and said silicon nitride film has a boron concentration of less than $1 \times 10^{16}$ atoms/cm$^3$.

3. A transistor according to claim 1, wherein said insulating substrate is a glass substrate.

* * * * *